US010149052B2

United States Patent
Akasaka et al.

(10) Patent No.: US 10,149,052 B2
(45) Date of Patent: Dec. 4, 2018

(54) ELECTRONIC DEVICE AND VIBRATION INFORMATION GENERATION DEVICE

(71) Applicant: NIKON CORPORATION, Tokyo (JP)

(72) Inventors: Satoshi Akasaka, Yokohama (JP); Toshitsugu Il, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/165,560

(22) Filed: May 26, 2016

(65) Prior Publication Data

US 2016/0360316 A1    Dec. 8, 2016

Related U.S. Application Data

(63) Continuation of application No. PCT/JP2014/081853, filed on Dec. 2, 2014.

(30) Foreign Application Priority Data

Dec. 2, 2013   (JP) ................. 2013-249232

(51) Int. Cl.
  *H04R 3/04*     (2006.01)
  *G06F 3/01*     (2006.01)
  (Continued)

(52) U.S. Cl.
  CPC ............... *H04R 3/04* (2013.01); *G06F 3/016* (2013.01); *H03G 3/3005* (2013.01);
  (Continued)

(58) Field of Classification Search
  CPC .... H04R 2499/11; H04R 3/04; H04R 1/1041; H03G 5/165
  (Continued)

(56) References Cited

U.S. PATENT DOCUMENTS

2007/0195963 A1*  8/2007  Ko .................. H04S 7/306
                                                381/26
2008/0070516 A1*  3/2008  Lee ................ H04R 5/04
                                                455/90.1
(Continued)

FOREIGN PATENT DOCUMENTS

| JP | 2008-130055 | 6/2008 |
| JP | 2010-211878 | 9/2010 |
| JP | 2012-520516 | 9/2012 |

OTHER PUBLICATIONS

International Search Report for PCT/JP2014/081853, dated Feb. 24, 2015.

(Continued)

*Primary Examiner* — Alexander Jamal

(57) ABSTRACT

An electronic device includes a vibration generation unit configured to generate vibration and a switching unit configured to perform switching between a first mode for causing the vibration generation unit to generate the vibration on the basis of first vibration information including information indicating an amplitude and a frequency, and a second mode for causing the vibration generation unit to generate the vibration on the basis of second vibration information including information indicating an amplitude and a frequency, wherein the second vibration information is data obtained by reducing an amplitude of a predetermined frequency band in the first vibration information.

5 Claims, 5 Drawing Sheets

(51) Int. Cl.
    *H03G 3/30*     (2006.01)
    *H04R 29/00*     (2006.01)

(52) U.S. Cl.
    CPC ......... *H04R 29/00* (2013.01); *H04R 2400/03* (2013.01); *H04R 2420/05* (2013.01); *H04R 2499/11* (2013.01)

(58) Field of Classification Search
    USPC .............. 381/62, 162, 26, 58, 101, 102, 107
    See application file for complete search history.

(56) References Cited

U.S. PATENT DOCUMENTS

| | | | |
|---|---|---|---|
| 2009/0088220 A1* | 4/2009 | Persson | G06F 1/1626 455/567 |
| 2010/0230179 A1 | 9/2010 | Uchiyama et al. | |
| 2013/0044049 A1 | 2/2013 | Biggs et al. | |

OTHER PUBLICATIONS

Written Opinion of the International Search Authority for PCT/JP2014/081853, dated Feb. 24, 2015.
Japanese Office Action dated Mar. 6, 2018, in corresponding Japanese Patent Application No. 2015-551514.

\* cited by examiner

ELECTRONIC DEVICE AND VIBRATION INFORMATION GENERATION DEVICE

This application claims the benefit of priority from the Japanese Patent Application No. 2013-249232, filed on Dec. 2, 2013, and this application is a continuation application of the international application PCT/JP2014/081853 filed on Dec. 2, 2014. The entire contents of the application are incorporated herein by reference.

BACKGROUND

Field of the Invention

The present invention relates to an electronic device and a vibration information generation device.

Related Art

Conventionally, electronic devices vibrate touch panels to generate tactile feedback. When the touch panel is vibrated, a sound is generated by the vibration, and this may cause annoyance to a user. Thus, a sound from vibration for tactile feedback is made inconspicuous by generating a sound from vibration of the touch panel at a high frequency rather than vibration for generating tactile feedback (for example, Japanese Unexamined Patent Application, First Publication No. 2008-130055).

SUMMARY

However, in a conventional electronic device, there is a problem in that sound leakage to surroundings other than a user is caused because a sound for causing a sound from the vibration for tactile feedback to be inconspicuous is generated in addition to the sound from the vibration for tactile feedback.

An objective of an aspect according to the present invention is to provide an electronic device and a vibration information generation device capable of suppressing sound leakage to surroundings when vibration is generated.

An electronic device of an aspect according to the present invention includes a vibration generation unit configured to generate vibration; and a switching unit configured to perform switching between a first mode for causing the vibration generation unit to generate the vibration on the basis of first vibration information including information indicating an amplitude and a frequency and a second mode for causing the vibration generation unit to generate the vibration on the basis of second vibration information including information indicating an amplitude and a frequency, wherein the second vibration information is data obtained by reducing an amplitude of a predetermined frequency band in the first vibration information.

According to the aspect of the present invention, it is possible to suppress sound leakage to surroundings when vibration is generated.

DESCRIPTION OF EMBODIMENTS

First Embodiment

Figure 1A:
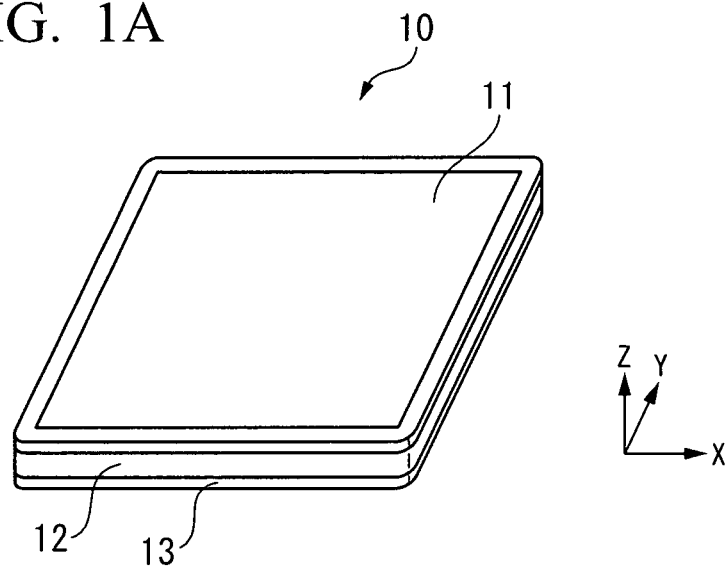
FIG. 1A is an exterior view illustrating an exterior configuration of an electronic device 10 according to a first embodiment of the present invention.
Figure 1B:
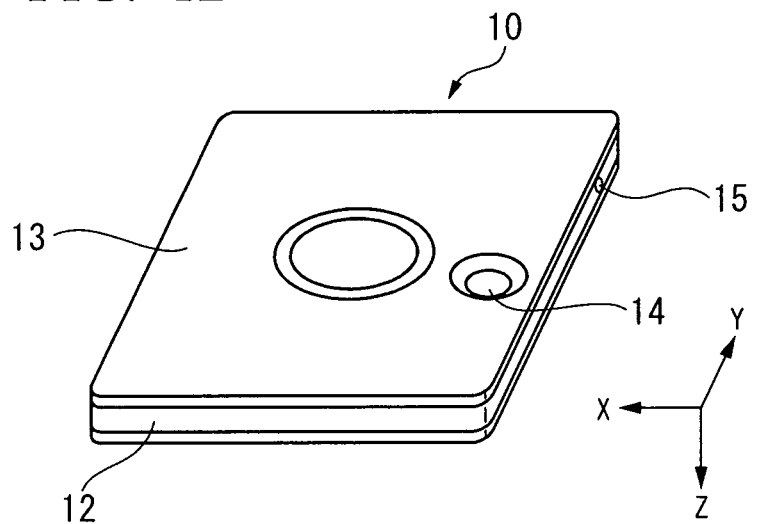
FIG. 1B is an exterior view illustrating the exterior configuration of the electronic device 10 according to the first embodiment of the present invention.

Hereinafter, the first embodiment of the present invention will be described with reference to the drawings. FIGS. 1A and 1B are exterior views illustrating an exterior configuration of an electronic device 10 according to the first embodiment of the present invention. Hereinafter, in the present embodiment, a configuration of the electronic device 10 will be described using an XYZ orthogonal coordinate system. The XYZ orthogonal coordinate system is a coordinate system based on the electronic device 10. In the XYZ orthogonal coordinate system, a stacking direction of each component of the electronic device 10 is assumed to be a Z direction. In addition, a plane orthogonal to the Z direction is designated as an XY plane and orthogonal directions in the XY plane are assumed to be X and Y directions.

The electronic device 10 has, for example, substantially a rectangular shape in a Z-direction view, and includes a configuration in which a touch panel 11, a main body unit 12, and a back cover 13 are stacked in the Z direction. FIG. 1A is a view of the electronic device 10 viewed from the side of the touch panel 11 and FIG. 1B is a view of an electronic device 10 viewed from the side of the back cover 13. As illustrated in FIG. 1B, an imaging unit 14 is provided on the side of the back cover 13 of the electronic device 10. Also, a sound output terminal 15 is provided in a side surface of the electronic device 10. The sound output terminal 15 is a connection terminal such as a phone jack for connecting a sound output device such as headphones.

Figure 2:
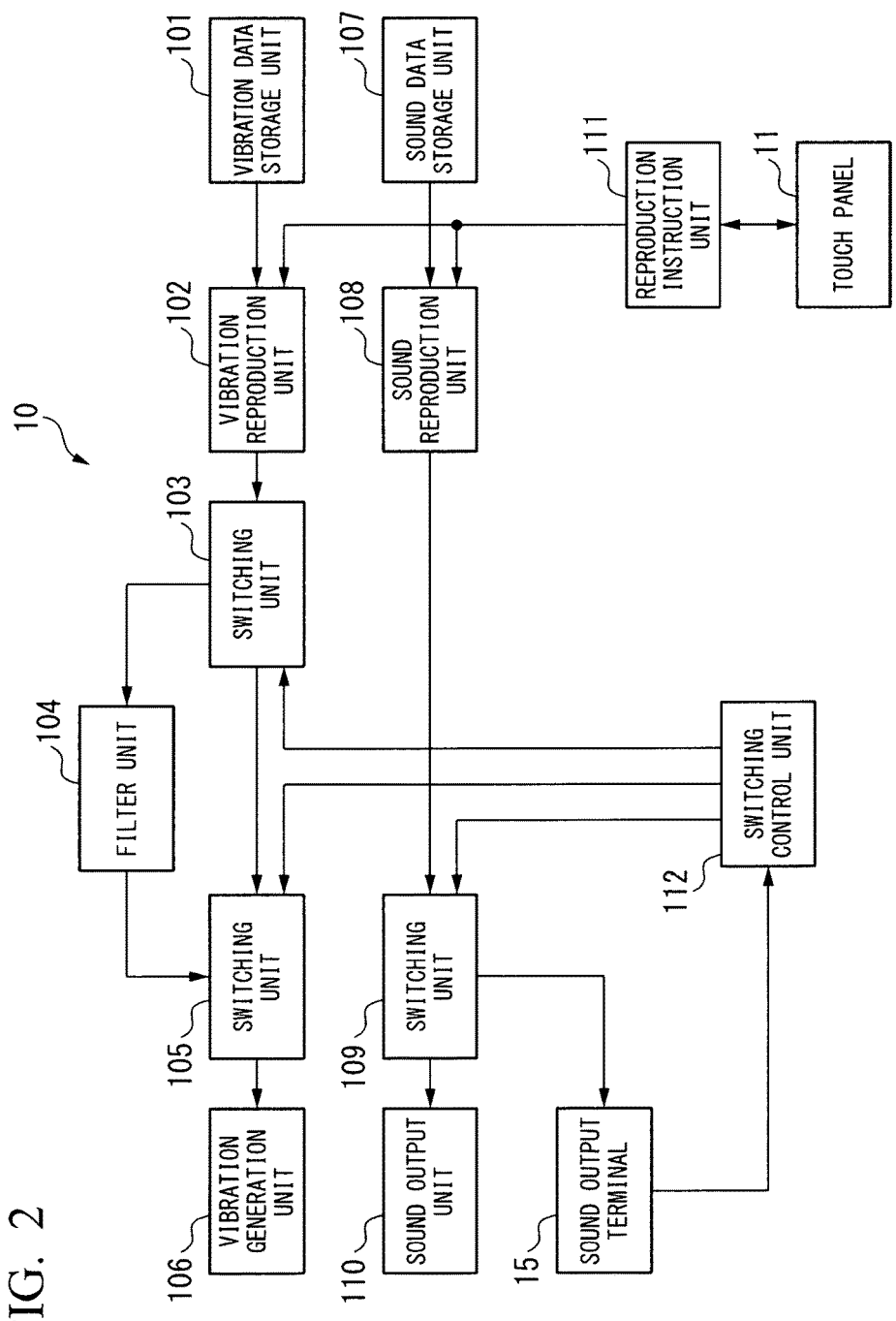
FIG. 2 is a schematic block diagram illustrating a configuration of the electronic device 10 in the first embodiment.

FIG. 2 is a schematic block diagram illustrating a configuration of the electronic device 10. The electronic device 10 is configured to include a vibration data storage unit 101, a vibration reproduction unit 102, a switching unit 103, a filter unit 104, a switching unit 105, a vibration generation unit 106, a sound data storage unit 107, a sound reproduction unit 108, a switching unit 109, a sound output unit 110, a reproduction instruction unit 111, a switching control unit 112, a touch panel 11, and a sound output terminal 15. The vibration data storage unit 101 stores vibration data including information indicating an amplitude and a frequency of vibration. The vibration reproduction unit 102 (a vibration information acquisition unit) reads vibration data designated from the reproduction instruction unit 111 from the vibration data storage unit 101 and generates a vibration signal (first vibration information) for generating vibration indicated by the vibration data. Also, the vibration data is, for example, data obtained by recording displacement of a physical object B in a direction perpendicular to a surface of a physical object A when the surface of the physical object A is rubbed against the physical object B. The vibration data may be data for which sampling values are arranged in time series as in the format of pulse code modulation (PCM) or encoded data as in advanced audio coding (AAC) or the like.

According to an instruction from the switching control unit 112, the switching unit 103 inputs a vibration signal (second vibration information) generated by the vibration reproduction unit 102 to the filter unit 104 or the switching unit 105. The filter unit 104 filters the vibration signal input from the switching unit 103 and inputs the filtered vibration signal to the switching unit 105. A characteristic of filtering in the filter unit 104 is a characteristic for decreasing an amplitude of a predetermined frequency band. Specifically, in an equal loudness curve, a frequency higher than 1 KHz to 3 KHz at which a minimum audible threshold is a small value has a characteristic which decreases the amplitude. Also, a characteristic of filtering may be a characteristic which sets the amplitude of the predetermined frequency band to zero. Also, a specific example of the characteristic will be described below.

According to an instruction from the switching control unit 112, the switching unit 105 inputs a vibration signal input from the filter unit 104 or a vibration signal input from the switching unit 103 to the vibration generation unit 106. The vibration generation unit 106 is a voice coil motor (VCM) which generates vibration according to a vibration signal input from the switching unit 105. The vibration generated by the vibration generation unit 106 is transferred to a user holding the electronic device 10 via the back cover 13. Also, the vibration generation unit 106 may be configured to generate the vibration according to the vibration signal by another element such as a piezoelectric element.

The sound data storage unit 107 stores sound data which is data indicating a waveform of a sound. Also, the sound data is data obtained by recording a sound generated during rubbing when vibration data to be reproduced simultaneously with the sound data is, for example, data when a surface of a physical object A is rubbed against a physical object B. The sound reproduction unit 108 reads sound data designated from the reproduction instruction unit 111 from the sound data storage unit 107 and generates a sound signal for generating a sound indicated by the sound data. The sound reproduction unit 108 inputs the generated sound signal to the switching unit 109.

According to an instruction from the switching control unit 112, the switching unit 109 inputs the input sound signal to the sound output unit 110 or the sound output terminal 15. The sound output unit 110 is a speaker for outputting a sound according to the input sound signal. Also, the sound output unit 110 is provided inside the main body unit 12.

The sound output terminal 15 inputs the sound signal input from the switching unit 109 to a connected device. Also, when a sound output device is connected, the sound output terminal 15 notifies the switching control unit 112 that the sound output device is connected. According to the notification from the sound output terminal 15, the switching control unit 112 determines a normal mode (a first mode) or a silent mode (a second mode).

When the normal mode is determined, the switching control unit 112 sends instructions to the switching units 103, 105, and 109 as follows in order to cause vibration according to a vibration signal which is not filtered to be generated and output a sound from the sound output unit 110. That is, the switching control unit 112 instructs the switching unit 103 to input the vibration signal to the switching unit 105, instructs the switching unit 105 to input the vibration signal input from the switching unit 103 to the vibration generation unit 106, and instructs the switching unit 109 to input the sound signal to the sound output unit 110.

Also, when the silent mode is determined, the switching control unit 112 sends instructions to the switching units 103, 105, and 109 as follows in order to cause vibration according to the filtered vibration signal to be generated and output a sound from a sound output device connected to the sound output terminal 15. That is, the switching control unit 112 instructs the switching unit 103 to input the vibration signal to the filter unit 104, instructs the switching unit 105 to input the vibration signal input from the filter unit 104 to the vibration generation unit 106, and instructs the switching unit 109 to input the sound signal to the sound output terminal 15.

For example, the reproduction instruction unit 111 causes a touch panel to display a content selection screen. The reproduction instruction unit 111 instructs the vibration reproduction unit 102 to reproduce vibration data of content designated by a user using the touch panel 11 and instructs the sound reproduction unit 108 to reproduce sound data of the content.

Figure 3:
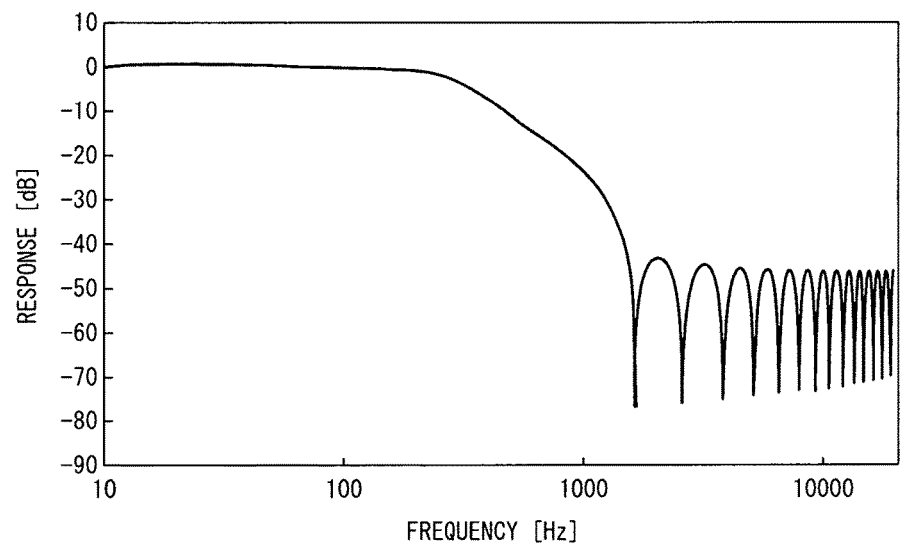
FIG. 3 is a graph illustrating a frequency characteristic of a filter unit 104 in the first embodiment.

FIG. 3 is a graph illustrating a frequency characteristic of the filter unit 104. In FIG. 3, the horizontal axis represents a frequency [Hz] and the vertical axis represents a response [dB]. As illustrated in FIG. 3, the characteristic of the filter unit 104 is −40 dB or less at 1500 Hz or more. That is, the filter unit 104 is a low-pass filter which suppresses 1500 Hz or more.

Figure 4:
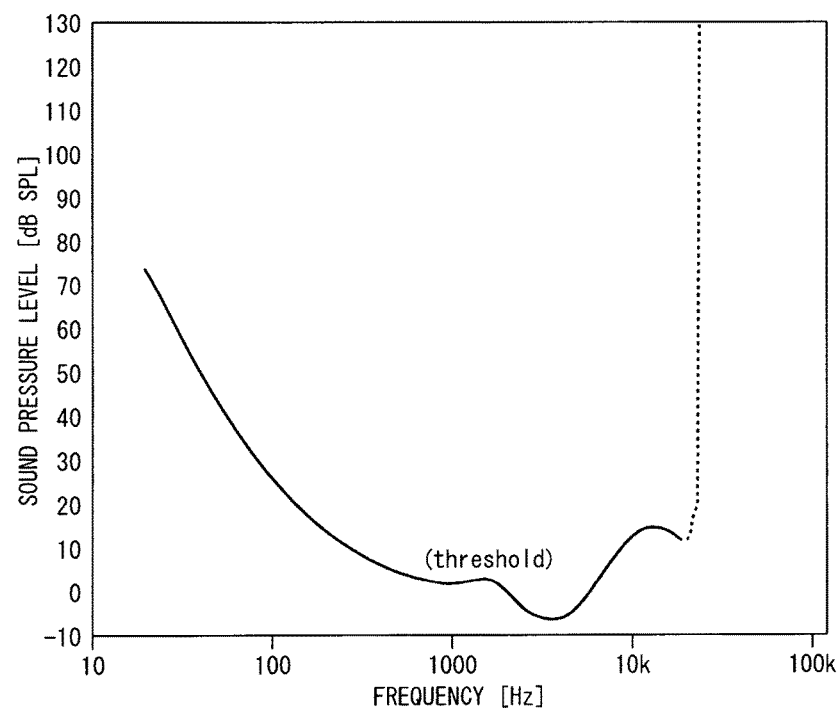
FIG. 4 is a graph illustrating an equal loudness curve of a minimum audible threshold.

FIG. 4 is a graph illustrating an equal loudness curve of a minimum audible threshold. In FIG. 4, the horizontal axis represents a frequency [Hz] and the vertical axis represents a sound pressure level [dB SPL]. Because FIG. 4 is the equal loudness curve of the minimum audible threshold, sensitivity is better when a value of the sound pressure level is smaller. As illustrated in FIG. 4, a human ear has good sensitivity of 1 KHz to 6 KHz, and has particularly peak sensitivity in the vicinity of 3 KHz.

Figure 5:
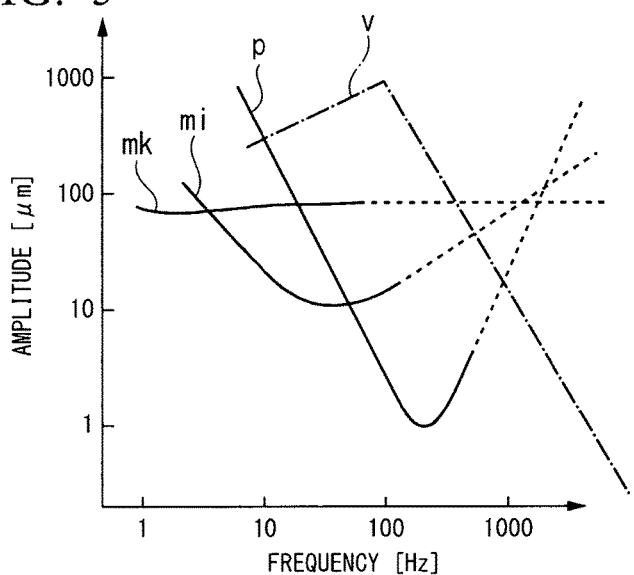
FIG. 5 is a graph illustrating overviews of a sensitivity characteristic of a tactile organ of skin and an output characteristic of a voice coil motor (VCM).

On the other hand, FIG. 5 is a graph illustrating overviews of a sensitivity characteristic of a tactile organ in skin and an output characteristic of a VCM. In FIG. 5, the horizontal axis represents a frequency [Hz] and the vertical axis represents an amplitude [μm]. A graph p indicates a sensitivity characteristic of a Pacinian corpuscle, a graph mi indicates a sensitivity characteristic of a Meissner corpuscle, and a graph mk indicates a sensitivity characteristic of Merkel's disc. Also, broken lines in the graphs p, mi, and mk indicate estimated values. Thus, a tactile organ has the highest sensitivity in the vicinity of 200 Hz, but sensitivity rapidly decreases at 200 Hz or more. Also, a graph v has an output characteristic of the VCM and has a peak in the vicinity of 100 Hz.

Returning to FIG. 3, the filter unit 104 causes a low frequency band to pass from 200 Hz, that is, a frequency at which the sensitivity of the tactile organ is highest. Further, the filter unit 104 suppresses a high frequency band in the vicinity of 1500 Hz at which the sensitivity of an ear is good and the output of the VCM is low. Thus, a difference between vibration sensed in the silent mode by a user's fingers or the like holding the electronic device 10 and vibration sensed in the normal mode is suppressed. It is possible to suppress a magnitude (a loudness) of sound leakage to surroundings when the vibration is generated to be felt by humans.

Thus, the electronic device 10 has the vibration generation unit 106 and the switching units 103 and 105. The vibration generation unit 106 generates vibration. The switching units 103 and 105 perform switching between the normal mode for causing the vibration generation unit 106 to generate vibration according to a first vibration signal including information indicating an amplitude and a frequency and the silent mode for causing the vibration generation unit 106 to generate vibration according to a second vibration signal. The second vibration signal is data obtained by reducing the amplitude of the predetermined frequency band of the first vibration signal.

Thus, it is possible to suppress sound leakage to the surroundings when vibration is generated.

Further, the predetermined frequency band is determined on the basis of an equal loudness curve. Thus, it is possible to suppress a difference between vibration felt by a user's fingers or the like holding the electronic device 10 when the first vibration signal is used and vibration felt by a user's fingers or the like holding the electronic device 10 when the second vibration signal is used.

Further, the electronic device 10 includes the vibration reproduction unit 102 and the filter unit 104. The vibration reproduction unit 102 acquires the first vibration signal. The filter unit 104 generates the second vibration signal by filtering the first vibration signal acquired by the vibration reproduction unit 102 using a characteristic based on the equal loudness curve.

Thus, it is possible to generate the second vibration signal if the first vibration signal can be acquired and suppress sound leakage to the surroundings when vibration is generated.

Further, the electronic device 10 includes the sound output terminal 15, the sound output unit 110, and the switching control unit 112. The sound output terminal 15 outputs a sound signal to a connected device. The sound output unit 110 outputs a sound according to the sound signal when no device is connected to the sound output terminal 15. The switching control unit 112 indicates the normal mode to the switching units 103 and 105 when no device is connected to the sound output terminal 15 and indicates the silent mode to the switching units 103 and 105 when a device is connected to the sound output terminal 15.

Thus, when headphones or the like are connected to the sound output terminal 15 so that no reproduced sound is leaked to the surroundings, the silent mode operates and the sound leakage to the surroundings can be suppressed when the vibration is generated.

Second Embodiment

Figure 6:
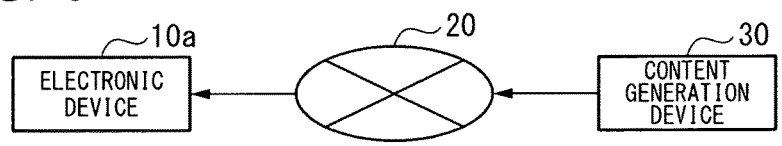
FIG. 6 is a schematic block diagram illustrating a configuration of a content reproduction system according to a second embodiment of the present invention.

Hereinafter, the second embodiment of the present invention will be described with reference to the drawings. FIG. 6 is a schematic block diagram illustrating a configuration of a content reproduction system according to the second embodiment of the present invention. The content reproduction system is configured to include an electronic device 10*a*, a network 20, and a content generation device 30. Also, in the present embodiment, the electronic device 10*a* generates vibration according to a filtered vibration signal in a silent mode, and the electronic device 10*a* pre-stores vibration data indicating the filtered vibration signal.

The content generation device 30 (a vibration information generation device) stores content including vibration data and sound data. The content generation device 30 filters vibration data (first vibration data) for the normal mode and generates vibration data (second vibration data) for the silent mode. Although the content generation device 30 distributes content when the content is requested from the electronic device 10*a*, both the first vibration data and the second vibration data are distributed at that time as the vibration data.

The network 20 is a network such as the Internet for communicably connecting the content generation device 30 and the electronic device 10*a*. The electronic device 10*a* receives and stores content distributed by the content generation device 30. Also, the electronic device 10*a* reproduces the received and stored content. Also, the electronic device 10*a* has an exterior similar to that of the electronic device 10 illustrated in FIGS. 1A and 1B. Also, the content generation device 30 may transmit content to the electronic device 10 via a portable storage medium such as a flash memory or a digital versatile disc (DVD) or a one-way communication path of a broadcasting a wave or the like without the network 20.

Figure 7:
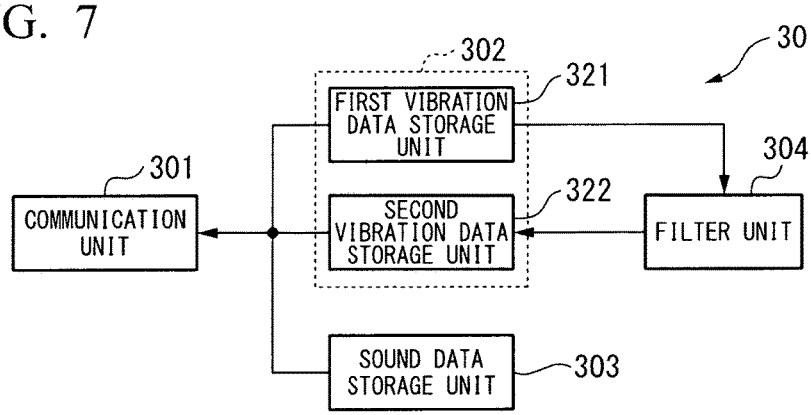
FIG. 7 is a schematic block diagram illustrating a configuration of a content generation device 30 in the second embodiment.

FIG. 7 is a schematic block diagram illustrating a configuration of the content generation device 30. The content generation device 30 is configured to include a communication unit 301, a vibration data storage unit 302, a sound data storage unit 303, and a filter unit 304. The vibration data storage unit 302 is configured to include a first vibration data storage unit 321 and a second vibration data storage unit 322. The communication unit 301 communicates with the electronic device 10*a* via the network 20. When a request for content is received from the electronic device 10*a*, the communication unit 301 reads vibration data and sound data of the content from the vibration data storage unit 302 and the sound data storage unit 303 and distributes the read vibration data and the read sound data to the electronic device 10*a* as a response to the request.

The first vibration data storage unit 321 (a vibration information acquisition unit) stores the first vibration data (first vibration information) which is the vibration data for the normal mode. The second vibration data storage unit 322 stores the second vibration data (second vibration information) which is vibration data for the silent mode. The sound data storage unit 303 stores sound data. The filter unit 304 is a filter having a filter characteristic which is similar to that of the filter unit 104 of FIG. 2. The filter unit 304 generates the second vibration data by filtering the first vibration data stored by the first vibration data storage unit 321.

The filter unit 304 causes the second vibration data storage unit 322 to store the generated second vibration data.

Figure 8:
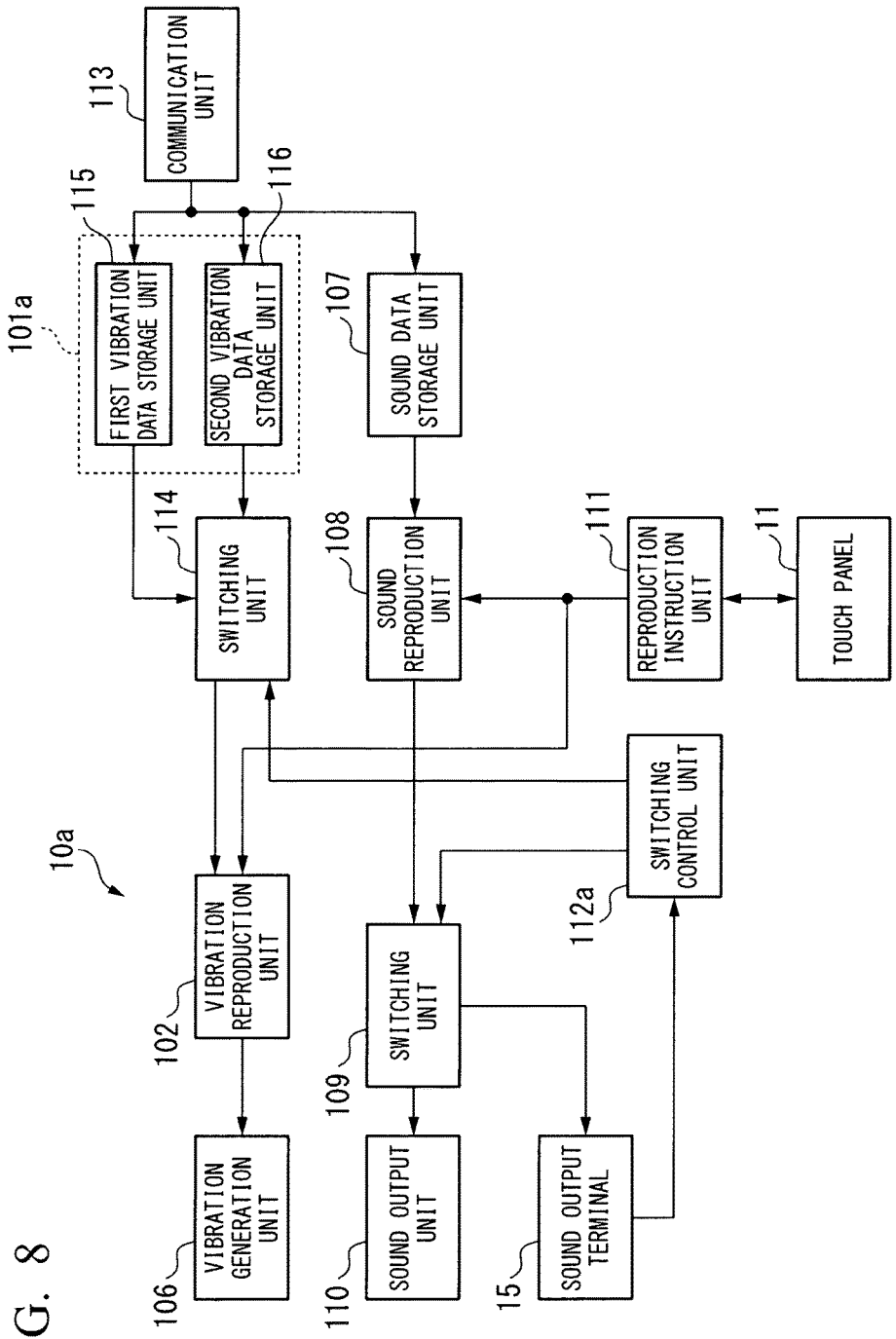
FIG. 8 is a schematic block diagram illustrating a configuration of an electronic device 10a in the second embodiment.

FIG. 8 is a schematic block diagram illustrating a configuration of the electronic device 10*a*. Parts of FIG. 8 corresponding to those of FIG. 2 are assigned the same reference numerals (11, 15, 102, and 106 to 111) and description thereof will be omitted. The electronic device 10*a* is configured to include a touch panel 11, a sound output terminal 15, a vibration data storage unit 101*a*, a vibration reproduction unit 102, a vibration generation unit 106, a sound data storage unit 107, a sound reproduction unit 108, a switching unit 109, a sound output unit 110, a reproduction instruction unit 111, a switching control unit 112*a*, a communication unit 113, and a switching unit 114. The vibration data storage unit 101*a* is configured to include a first vibration data storage unit 115 and a second vibration data storage unit 116.

The communication unit 113 (an acquisition unit) communicates with the content generation device 30 via the network 20. The communication unit 113 requests the content generation device 30 to provide content. The communication unit 113 receives the content distributed as a response to the request. The communication unit 113 causes the first vibration data storage unit 115 to store the first vibration data of the received content, causes the second vibration data storage unit 116 to store the second vibration data of the received content, and causes the sound data storage unit 107 to store the sound data of the received content.

The first vibration data storage unit 115 stores the first vibration data which is vibration data for the normal mode. The second vibration data storage unit 116 stores the second vibration data which is vibration data for the silent mode. According to an instruction from the switching control unit 112a, the switching unit 114 reads the first vibration data stored by the first vibration data storage unit 115 or the second vibration data stored by the second vibration data storage unit 116 and inputs the read first or second vibration data to the vibration reproduction unit 102. The vibration reproduction unit 102 is similar to the vibration reproduction unit 102 of FIG. 2, but inputs a generated vibration signal to the vibration generation unit 106.

Similar to the switching control unit 112 of FIG. 2, the switching control unit 112a determines the normal mode and the silent mode. When the normal mode is determined, the switching control unit 112a sends instructions to the switching units 109 and 114 as follows so that the vibration generation unit 106 generates vibration according to the first vibration data and the sound output unit 110 outputs a sound. That is, the switching control unit 112a instructs the switching unit 114 to read the first vibration data from the first vibration data storage unit 115 and input the read first vibration data to the vibration reproduction unit 102, and instructs the switching unit 109 to input a sound signal to the sound output unit 110.

Also, when the silent mode is determined, the switching control unit 112a sends instructions to the switching units 109 and 114 as follows so that the vibration generation unit 106 generates vibration according to the second vibration data and a sound is output from a sound output device connected to the sound output terminal 15. That is, the switching control unit 112a instructs the switching unit 114 to read the second vibration data from the second vibration data storage unit 116 and input the read second vibration data to the vibration reproduction unit 102, and instructs the switching unit 109 to input a sound signal to the sound output terminal 15.

Also, in the present embodiment, vibration generated in the silent mode is vibration according to filtered vibration data as in the first embodiment. Thus, a difference between vibration sensed in the silent mode by a user's fingers or the like holding the electronic device 10a and vibration sensed in the normal mode is suppressed. Also, it is possible to suppress a magnitude (a loudness) of sound leakage to surroundings when the vibration is generated to be felt by humans.

Also, the electronic device 10a includes the vibration generation unit 106 and the switching unit 114. The vibration generation unit 106 generates vibration. The switching unit 114 performs switching between the normal mode for causing the vibration generation unit 106 to generate vibration according to the first vibration data indicating a waveform of vibration and the silent mode for causing the vibration generation unit 106 to generate vibration according to the second vibration data. The second vibration data is data obtained by filtering the first vibration data using a characteristic based on an equal loudness curve.

Thus, similar to the electronic device 10, the electronic device 10a can also suppress sound leakage to the surroundings when vibration is generated.

Further, the electronic device 10a includes the communication unit 113 which acquires the first vibration information and the second vibration information from another device.

Thus, it is possible to suppress sound leakage to the surroundings when vibration is generated even when no filter is provided.

Also, the content generation device 30 includes the first vibration data storage unit 321 which acquires the first vibration data and the filter unit 304 which generates the second vibration data by filtering the first vibration data acquired by the first vibration data storage unit 321 using a characteristic based on the equal loudness curve.

Thereby, the electronic device 10a can suppress sound leakage to the surroundings when vibration is generated.

Also, although an example in which content includes vibration data and sound data has been described in the above-mentioned embodiments, content may include moving-image data, still-image data, etc. In this case, the electronic devices 10 and 10a include an image reproduction unit and reproduce the moving-image data and the still-image data to display the reproduced moving-image data and still-image data on the touch panel 11.

Also, although the vibration signal is a digital signal and the filter unit 104 is a digital filter in the above-mentioned embodiments, the vibration signal may be an analog signal. In this case, the filter unit 104 is an analog filter.

Also, in the above-mentioned embodiments, the determination of the normal mode and the silent mode is performed on the basis of whether a sound output device is connected to the sound output terminal 15. However, a user may designate the normal mode or the silent mode. In this case, when the user designates the silent mode and no sound output device is connected to the sound output terminal 15, it is unnecessary to reproduce the sound data.

Also, an example in which vibration generated by the vibration generation unit 106 is transferred to fingers or the like holding the electronic device 10 or 10a via the back cover 13 has been described in the above-mentioned embodiments, but the vibration may be transferred to fingers or the like in contact with the touch panel 11 via the touch panel 11.

Also, processes of the units may be executed by recording a program for implementing functions of the electronic device 10 in FIG. 2, the content generation device 30 in FIG. 7, and the electronic device 10a in FIG. 8 on a non-transitory computer-readable recording medium and causing a computer system to read and execute the program recorded on the recording medium. Also, "computer system" used here is assumed to include an operating system (OS) and hardware such as peripheral devices.

In addition, "computer-readable recording medium" refers to a storage apparatus including a flexible disk, a magneto-optical disc, a read-only memory (ROM), or a portable medium such as a compact disc (CD)-ROM, and a hard disk embedded in the computer system. Further, "computer-readable recording medium" is assumed to include a computer-readable recording medium for dynamically holding a program for a short time as in a communication line when the program is transmitted via a network such as the Internet or a communication circuit such as a telephone circuit and a computer-readable recording medium for holding the program for a predetermined time as in a volatile memory inside the computer system including a server and a client when the program is transmitted. In addition, the above-described program may be used to implement some of the above-described functions. Further, the program may implement the above-described functions in combination with a program already recorded on the computer system.

Also, the above-mentioned functional blocks of the electronic device 10 in FIG. 2, the content generation device 30 in FIG. 7, and the electronic device 10a in FIG. 8 may be configured as individual chips or some or all of the functional blocks may be integrated in one chip. The method of implementing such an integrated circuit is not limited to large scale integration (LSI), and the integrated circuit may be implemented by a dedicated circuit or a general-purpose processor. It may be hybrid or monolithic. Some functional blocks may be implemented by hardware and some functional blocks may be implemented by software.

Also, when integrated circuit technologies which reallocate LSIs emerge with the advancement of semiconductor technologies, it is also possible to use an integrated circuit by such technologies.

Although embodiments of the present invention have been described above with reference to the drawings, specific configurations are not limited to the embodiments, and a design change, etc. may also be included without departing from the scope of the present invention.

What is claimed is:

1. An electronic device comprising:
   a vibration generator configured to generate vibration;
   a switch configured to perform switching between a first mode for causing the vibration generator to generate the vibration on the basis of first vibration information including information indicating an amplitude and a frequency, and a second mode for causing the vibration generator to generate the vibration on the basis of second vibration information including information indicating an amplitude and a frequency;
   a sound output terminal configured to output a sound signal to a connected device;
   a speaker configured to output a sound according to the sound signal when a device is not connected to the sound output terminal; and
   a switch controller configured to
      indicate the first mode to the switch when a device is not connected to the sound output terminal and
      indicate the second mode to the switch when a device is connected to the sound output terminal,
   wherein the second vibration information is data obtained by reducing an amplitude of a frequency band of 1.5 KHz to 6 KHz in the first vibration information.

2. The electronic device according to claim 1, wherein the second vibration information is data obtained by setting the amplitude of the predetermined frequency band in the first vibration information to zero.

3. The electronic device according to claim 1, wherein the predetermined frequency band is determined on the basis of an equal loudness curve.

4. The electronic device according to claim 1, further comprising:
   a communication interface configured to acquire the first vibration information; and
   a filter configured to generate the second vibration information by filtering the first vibration information acquired by the communication interface.

5. The electronic device according to claim 1, further comprising:
   a communication interface configured to acquire the first vibration information and the second vibration information from another device.

* * * * *